(12) United States Patent
Inaba et al.

(10) Patent No.: US 11,021,389 B2
(45) Date of Patent: Jun. 1, 2021

(54) SUPPORTING GLASS SUBSTRATE

(71) Applicant: AGC Inc., Chiyoda-ku (JP)

(72) Inventors: Seiji Inaba, Chiyoda-ku (JP); Yasunari Saito, Chiyoda-ku (JP); Kiyoshi Tamai, Chiyoda-ku (JP); Kazutaka Ono, Chiyoda-ku (JP); Yuha Kobayashi, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 16/941,631

(22) Filed: Jul. 29, 2020

(65) Prior Publication Data

US 2021/0032155 A1 Feb. 4, 2021

(30) Foreign Application Priority Data

Jul. 29, 2019 (JP) .................... PCT/JP2019/029695
Nov. 15, 2019 (JP) ............................ JP2019-206867

(51) Int. Cl.
*B32B 17/00* (2006.01)
*C03C 3/087* (2006.01)
(Continued)

(52) U.S. Cl.
CPC .............. *C03C 3/087* (2013.01); *C03C 3/085* (2013.01); *C03C 3/091* (2013.01); *C03C 3/095* (2013.01); *C03C 3/097* (2013.01); *H01L 23/15* (2013.01)

(58) Field of Classification Search
CPC ......... C03C 3/078; C03C 3/083; C03C 3/085; C03C 3/087
(Continued)

(56) References Cited

U.S. PATENT DOCUMENTS 5,145,540 A 9/1992 Foley et al.
5,981,015 A 11/1999 Zou et al.
(Continued)

FOREIGN PATENT DOCUMENTS

JP 3-150236 6/1991
JP H 10-079122 3/1998
(Continued)

OTHER PUBLICATIONS

Kunio Hayashi et al. "Densification of Compacted Magnesium Alumino-Silicate Glass Powders", Journal of the Ceramic Society of Japan, 1990, vol. 98, pp. 1070-1075).
(Continued)

*Primary Examiner* — Zachary M Davis
(74) *Attorney, Agent, or Firm* — Oblon, McClelland, Maier & Neustadt, L.L.P.

(57) ABSTRACT

A supporting glass substrate has a ratio of a Young's modulus (GPa) to a density (g/cm$^3$) that is 37.0 (GPa·cm$^3$/g) or more and the ratio has a value larger than a ratio calculation value, the ratio calculation value being a ratio of a Young's modulus (GPa) calculated from a composition to a density (g/cm$^3$). The ratio calculation value is represented by the following expression: $\alpha = 2 \cdot \Sigma\{(V_i \cdot G_i)/M_i \cdot X_i\}$, where, in the expression, $V_i$ is a filling parameter of a metal oxide contained in the supporting glass substrate, $G_i$ is a dissociation energy of a metal oxide contained in the supporting glass substrate, $M_i$ is a molecular weight of a metal oxide contained in the supporting glass substrate, and $X_i$ is a molar ratio of a metal oxide contained in the supporting glass substrate.

6 Claims, 3 Drawing Sheets

(51) Int. Cl.
*C03C 3/085* (2006.01)
*H01L 23/15* (2006.01)
*C03C 3/095* (2006.01)
*C03C 3/091* (2006.01)
*C03C 3/097* (2006.01)

(58) Field of Classification Search
USPC .................. 501/11, 53, 55, 68, 69, 70, 72
See application file for complete search history.

(56) References Cited

U.S. PATENT DOCUMENTS

| | | |
|---|---|---|
| 2012/0212794 A1 | 8/2012 | Giron et al. |
| 2014/0179510 A1* | 6/2014 | Allan .................. C03C 3/091 501/67 |
| 2017/0327408 A1 | 11/2017 | Nomura et al. |
| 2018/0082914 A1 | 3/2018 | Hanawa et al. |
| 2018/0151408 A1 | 5/2018 | Hanawa et al. |
| 2019/0161388 A1 | 5/2019 | Nomura et al. |
| 2019/0362754 A1 | 11/2019 | Sato et al. |
| 2019/0385920 A1 | 12/2019 | Hanawa et al. |

FOREIGN PATENT DOCUMENTS

| | | |
|---|---|---|
| JP | 2012-533776 | 12/2012 |
| JP | 6443668 | 12/2018 |
| WO | WO 2016/125787 | 8/2016 |
| WO | WO 2016/190303 | 12/2016 |
| WO | WO 2017/018275 | 2/2017 |
| WO | WO 2018/025727 | 2/2018 |
| WO | WO 2018/088563 | 5/2018 |

OTHER PUBLICATIONS

Rachman Chaim and Vladimir Talanker "Microstructure and Mechanical Properties of SiC Platelet/Cordierite Glass-Ceramic Composites" Journal of the American Ceramic Society, vol. 78, Issue 1, pp. 166-172 (Jan. 1995).
G.M. Singer and M. Tomozewa Cordierite-based oxyfluoride glasses and glass ceramics. Part 1. Glasses. Physics and Chemistry of Glasses, vol. 30, No. 3 pp. 86-95 (Jun. 1989).
International Search Report dated Sep. 10, 2019, in PCT/JP2019/029695 filed Jul. 29, 2019, citing documents AA to AC, AJ to AL, and AV therein.

* cited by examiner

SUPPORTING GLASS SUBSTRATE

CROSS-REFERENCE TO RELATED APPLICATION(S)

This application claims priority from the prior PCT application No. PCT/JP2019/029695 filed on Jul. 29, 2019 and the prior Japanese Patent Application No. 2019-206867 filed on Nov. 15, 2019, the entire contents of which are incorporated herein by reference.

BACKGROUND OF THE INVENTION

1. Field of the Invention

The present invention relates to a supporting glass substrate.

2. Description of the Related Art

Along with the reduction in sizes of electronic devices, there is an increasing demand for techniques for mounting semiconductor devices used in these electronic devices at high density. In recent years, for example, a fan out wafer level package (FOWLP) and a fan out panel level package (FOPLP) have been proposed as the techniques for mounting semiconductor devices at high density. Hereinafter, the FOWLP and the FOPLP are collectively referred to as the FOWLP and the like.

In the FOWLP and the like, a supporting glass substrate that supports a processing substrate may be used in order to suppress a deflection of the processing substrate on which semiconductor devices are stacked (see, for example, Japanese Patent No. 6443668).

In a supporting glass substrate used for supporting members, such as the supporting glass substrate for the FOWLP and the like, a reduction in weight is also required in addition to suppression of the deflection. In the supporting glass substrate, in a case in which a thickness is increased in order to suppress the deflection, a mass is increased, and in a case in which a thickness is decreased in order to reduce the weight, the deflection tends to occur. Therefore, it may be difficult to achieve both suppressing deflection and reducing weight.

The present disclosure has been made in view of the above problem, and an object of the present invention is to provide a supporting glass substrate in which suppressing deflection and reducing weight can be achieved.

SUMMARY OF THE INVENTION

It is an object of the present invention to at least partially solve the problems in the conventional technology.

To solve the problem and achieve the object above, the supporting glass substrate of the present disclosure has a ratio $\varepsilon/d$ (GPa·cm$^3$/g) of a Young's modulus $\varepsilon$ (GPa) to a density d (g/cm$^3$) that is 37.0 (GPa·cm$^3$/g) or more and the ratio $\varepsilon/d$ (GPa·cm$^3$/g) has a value larger than a ratio calculation value $\alpha$ (GPa·cm$^3$/g), the ratio calculation value $\alpha$ (GPa·cm$^3$/g) being a ratio of a Young's modulus $\varepsilon$ (GPa) to a density (g/cm$^3$) calculated from a composition. The ratio calculation value $\alpha$ (GPa·cm$^3$/g) is represented by the following expression:

$$\alpha = 2 \cdot \Sigma\{(V_i \cdot G_i / M_i) \cdot X_i\}$$

In the expression, $V_i$ is a filling parameter of a metal oxide contained in the supporting glass substrate, $G_i$ is a dissociation energy of a metal oxide contained in the supporting glass substrate, $M_i$ is a molecular weight of a metal oxide contained in the supporting glass substrate, and $X_i$ is a molar ratio of a metal oxide contained in the supporting glass substrate.

According to the present disclosure, suppressing deflection and reducing weight can be achieved.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a suitable embodiment of the present invention will be described in detail with reference to the accompanying drawings. The present invention is not limited to the embodiment, and in a case in which there are a plurality of embodiments, the present invention also includes configurations in which the respective embodiments are combined with each other.

Figure 1:
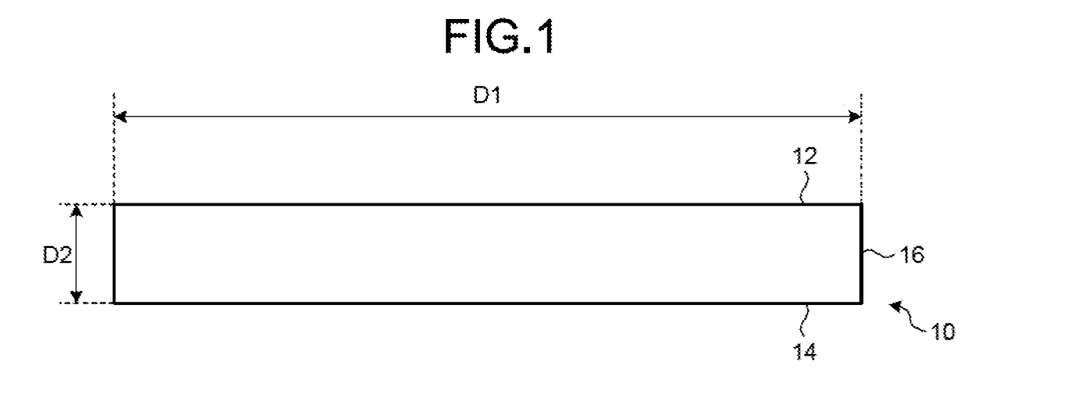
FIG. 1 is a schematic view of a supporting glass substrate according to the present embodiment.

FIG. 1 is a schematic view of a supporting glass substrate according to the present embodiment. As illustrated in FIG. 1, a supporting glass substrate 10 according to the present embodiment is used as a glass substrate for manufacturing a semiconductor package, and more specifically, a supporting glass substrate for manufacturing a FOWLP and the like. However, application of the supporting glass substrate 10 is not limited to manufacture of the FOWLP and the like and is optional, and the supporting glass substrate 10 may be used as a glass substrate used for supporting members. The FOWLP and the like include the above-described FOWLP and FOPLP.

In the supporting glass substrate 10, both suppressing deflection and reducing weight can be achieved by increasing a ratio $\varepsilon/d$ of a Young's modulus $\varepsilon$ to a density d. Specifically, the supporting glass substrate 10 has a ratio $\varepsilon/d$ of 32.0 (GPa·cm$^3$/g) or more and satisfies following Expression (1). A ratio calculation value $\alpha$ in Expression (1) is a calculation value of a ratio of a Young's modulus to a density of the supporting glass substrate 10, which is calculated from a composition of the supporting glass substrate 10, and details will be described later.

$$\varepsilon/d > \alpha \tag{1}$$

The ratio $\varepsilon/d$ is a value calculated using a measurement value of the Young's modulus $\varepsilon$ of the supporting glass substrate 10 and a measurement value of the density d of the supporting glass substrate 10.

In the present embodiment, the Young's modulus $\varepsilon$ of the supporting glass substrate 10 is a value measured based on propagation of an ultrasonic wave with 38DL PLUS manufactured by Olympus Corporation. In addition, in the present embodiment, the density d of the supporting glass substrate 10 is a value measured by the Archimedes' method. The ratio $\varepsilon/d$ is calculated by dividing the actually measured Young's modulus $\varepsilon$ by the actually measured density d. The unit of the Young's modulus $\varepsilon$ is GPa, the unit of the density d is $g/cm^3$, and the unit of the ratio $\varepsilon/d$ is $GPa \cdot cm^3/g$.

The ratio $\varepsilon/d$ is a value calculated using the measured values, whereas the ratio calculation value $\alpha$ is a value calculated from the composition of the supporting glass substrate 10 without using the measurement values of the Young's modulus $\varepsilon$ and the density d. It is known that a Young's modulus of glass can be calculated from a composition thereof. Therefore, the ratio calculation value $\alpha$ of the Young's modulus to the density of the supporting glass substrate 10 can be calculated from the composition of the supporting glass substrate 10. The composition of the supporting glass substrate 10 herein means a composition in a case in which the composition contained in the supporting glass substrate 10 is converted into a metal oxide.

In more detail, the ratio calculation value $\alpha$ corresponds to a value obtained as follows: an ionic size of a metal oxide is multiplied by a binding strength between ions of the metal oxide to obtain a value; the obtained value is divided by an ionic weight; and the divided value is totalized for each of the metal oxides and multiplied by 2. Specifically, the ratio calculation value $\alpha$ is calculated by following Expression (2).

$$\alpha = 2 \cdot \Sigma(P_i \cdot X_i) = 2 \cdot \Sigma\{(V_i \cdot G_i/M_i) \cdot X_i\} \qquad (2)$$

Here, $P_i$ is $(V_i \cdot G_i/M_i)$. $V_i$ $(cm^3/mol)$ is a filling parameter of a metal oxide contained in the supporting glass substrate 10, $G_i (kJ/cm^3)$ is a dissociation energy of a metal oxide contained in the supporting glass substrate 10, $M_i(g/mol)$ is a molecular weight of a metal oxide contained in the supporting glass substrate 10, and $X_i$ is a molar ratio of the metal oxide contained in the supporting glass substrate 10 to the entirety of the supporting glass substrate 10. The unit of $X_i$ is dimensionless. As illustrated in Expression (2), the ratio calculation value $\alpha$ is a value obtained such that the value $\{(V_i \cdot G_i/M_i) \cdot X_i\}$ calculated for each of the metal oxides contained in the supporting glass substrate 10 is totalized for all the metal oxides contained in the supporting glass substrate 10, and multiplied by 2. The unit of the ratio calculation value $\alpha$ is $GPa \cdot cm^3/g$.

In addition, $V_i$ is calculated by following Expression (3), and $G_i$ is calculated by following Expression (4).

$$V_i = 6.02 \cdot 10^{23} \cdot (4/3) \cdot \pi \cdot (x \cdot r_M^3 + y \cdot r_o^3) \qquad (3)$$

$$G_i = d_i/M_i \cdot \{x \cdot \Delta Hf(M_{gas}) + y \cdot \Delta Hf(O_{gas}) - \Delta Hf(M_x O_{ycrystal}) - (x+y) \cdot RT\} \qquad (4)$$

Here, $M_xO_y$ is the metal oxide contained in the supporting glass substrate 10.

M is a metal element, O is an oxygen element, x is a valence of the metal element M, and y is a valence of the oxygen element O.

$r_M$ is Shannon's ionic radii of the metal element M in the metal oxide $M_xO_y$, and $r_o$ is Shannon's ionic radii of the oxygen element O in the metal oxide $M_xO_y$. In addition, $d_i$ is the density of the metal oxide $M_xO_y$.

$\Delta Hf (M_{gas})$ is the standard enthalpy of formation of the metal element M in a gas state, $\Delta Hf (O_{gas})$ is the standard enthalpy of formation of the oxygen element O in a gas state, and $\Delta Hf (M_xO_{ycrystal})$ is the standard enthalpy of formation of the metal oxide $M_xO_y$. In addition, R is a gas constant, and T is an absolute temperature.

In the supporting glass substrate 10, the ratio $\varepsilon/d$ is 32.0 $(GPa \cdot cm^3/g)$ or more and the ratio $\varepsilon/d$ has a value larger than the ratio calculation value $\alpha$ calculated based on the composition.

That is, it can be said that the supporting glass substrate 10 is a member in which the ratio $\varepsilon/d$ of the Young's modulus to the density, which is obtained by the actual measurement, has a value larger than the ratio calculation value $\alpha$ that is a ratio of the Young's modulus to the density being calculated based on the composition.

Even the supporting glass substrate 10 is manufactured with low thickness and low weight, high rigidity can be achieved, by setting the ratio $\varepsilon/d$ of the supporting glass substrate 10 to 32.0 $(GPa \cdot cm^3/g)$ or more. Therefore, both suppressing deflection and reducing thickness and weight can be achieved. Furthermore, in the supporting glass substrate 10, the ratio $\varepsilon/d$ has the value larger than the ratio calculation value $\alpha$ calculated based on the composition; in other words, the Young's modulus per unit density is larger than the value expected based on the composition.

Therefore, in the supporting glass substrate 10, suppressing deflection and reducing weight can be achieved to a degree more than expected.

Figure 2:
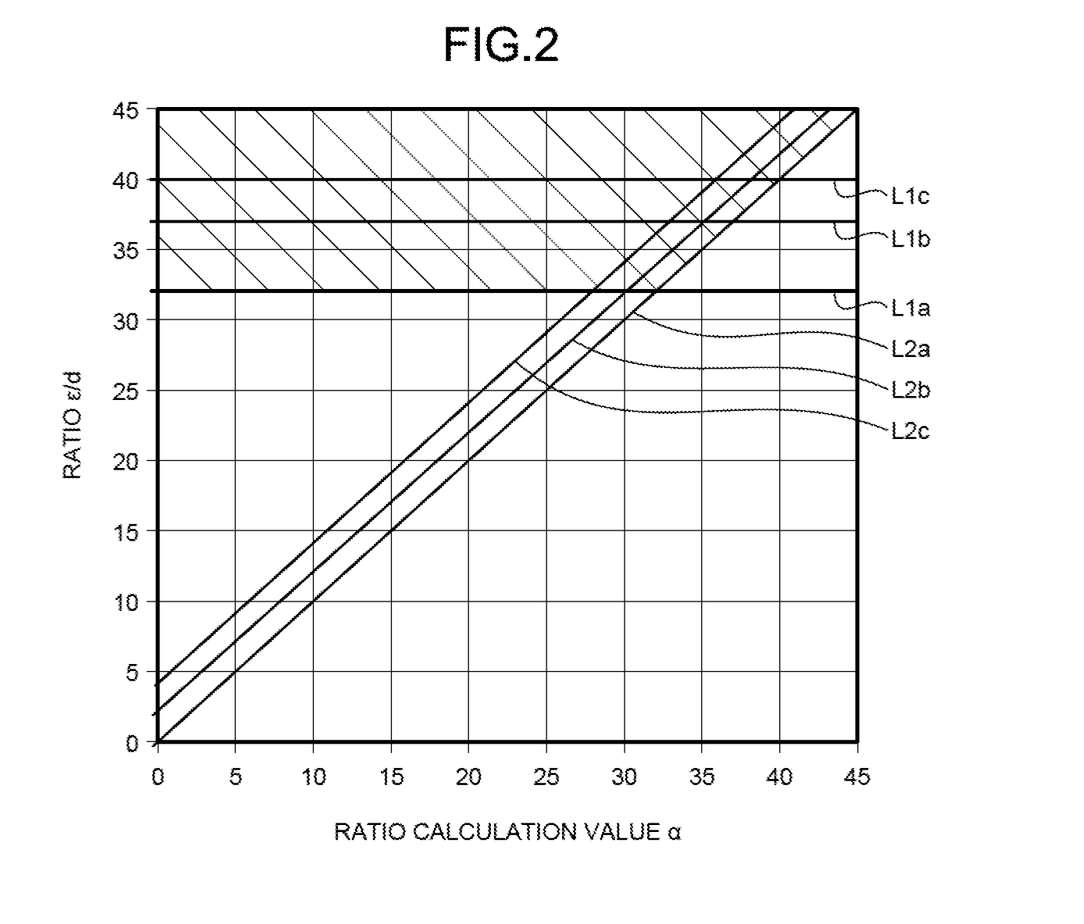
FIG. 2 is a graph for explaining performance of the supporting glass substrate according to the present embodiment.

FIG. 2 is a graph for explaining performance of the supporting glass substrate according to the present embodiment. FIG. 2 is a graph illustrating a range of the ratio $\varepsilon/d$ described above, in which a horizontal axis represents the ratio calculation value $\alpha$, and a vertical axis represents the ratio $\varepsilon/d$. The line segment L1a is a border line of the ratio $\varepsilon/d = 32.0$ $(GPa \cdot cm^3/g)$, and the line segment L2a is a border line of the ratio $\varepsilon/d$ = the ratio calculation value $\alpha$. In FIG. 2, it can be said that the ratio $\varepsilon/d$ of the supporting glass substrate 10 is plotted above the line segments L1a and L2a in a vertical axis direction. In other words, it can be said that the ratio $\varepsilon/d$ is plotted in the shaded area in FIG. 2.

The ratio $\varepsilon/d$ of the supporting glass substrate 10 is more preferably 37.0 $(GPa \cdot cm^3/g)$ or more, and even more preferably 40.0 $(GPa \cdot cm^3/g)$ or more. When the ratio $\varepsilon/d$ is 37.0 $(GPa \cdot cm^3/g)$ or more, it is possible to more suitably achieve suppressing deflection and reducing weight, and when the ratio $\varepsilon/d$ is 40.0 $(GPa \cdot cm^3/g)$ or more, it is possible to even more suitably achieve suppressing deflection and reducing weight.

In FIG. 2, the line segment L1b is a border line of the ratio $\varepsilon/d = 37.0$ $(GPa \cdot cm^3/g)$, and the line segment L1c is a border line of the ratio $\varepsilon/d = 40.0$ $(GPa \cdot cm^3/g)$.

In addition, in the supporting glass substrate 10, the ratio $\varepsilon/d$ more preferably satisfies following Expression (5), and even more preferably satisfies Expression (6). It is possible to more suitably achieve suppressing deflection and reducing weight by satisfying Expression (5), and it is possible to even more suitably achieve suppressing deflection and reducing weight by satisfying Expression (6).

$$\varepsilon/d > \alpha + 2.0 (GPa \cdot cm^3/g) \qquad (5)$$

$$\varepsilon/d > \alpha + 4.0 (GPa \cdot cm^3/g) \qquad (6)$$

In FIG. 2, the line segment L2b is a border line of $\varepsilon/d = \alpha + 2.0$ $(GPa \cdot cm^3/g)$, and the line segment L2c is a border line of $\varepsilon/d = \alpha + 4.0$ $(GPa \cdot cm^3/g)$.

Next, the composition of the supporting glass substrate 10 will be described. In the present embodiment, the supporting glass substrate 10 has the composition described later, and thereby, the ratio $\varepsilon/d$ can be 32.0 $(GPa \cdot cm^3/g)$ or more and can have the value larger than the ratio calculation value $\alpha$, which is an example of compositions described later. The supporting glass substrate 10 may have any composition as long as the ratio ε/d is 32.0 (GPa·cm$^3$/g) or more and has the value larger than the ratio calculation value α.

The supporting glass substrate 10 contains a base material and an additive material. The supporting glass substrate 10 preferably contains $SiO_2$ and $Al_2O_3$ as base materials. In the supporting glass substrate 10, a total content of $SiO_2$ and $Al_2O_3$ is preferably 50% to 85%, and more preferably 60% to 75%, as represented by mol % based on oxides. Here, 50% to 85% means 50% or more and 85% or less in a case in which the mol % of the total amount of the supporting glass substrate 10 is 100%, the same being applied hereinafter.

In addition, the supporting glass substrate 10 may contain $B_2O_3$ as a base material in addition to $SiO_2$ and $Al_2O_3$. A content of $B_2O_3$ is preferably 1% to 30%, and more preferably 3% to 10%, as represented by mol % based on oxides. The contents of the base materials are in such a range, whereby the ratio ε/d can be increased, and suppressing deflection and reducing weight can be suitably achieved. In addition, the supporting glass substrate 10 may contain at least one of $P_2O_5$, $Ga_2O_3$, AlN, and $Si_3N_4$ as a base material.

The additive material is a metal oxide. The supporting glass substrate 10 contains at least one of MgO, CaO, and $Y_2O_3$ as an additive material. In the supporting glass substrate 10, a content of the additive material, in other words, a total content of one or more components selected from the group consisting of MgO, CaO, and $Y_2O_3$ is preferably in a range of 15% to 50%, and more preferably 20% to 45%, as represented by mol % based on oxides.

The supporting glass substrate 10 preferably contains, among MgO, CaO, and $Y_2O_3$, only MgO, only MgO and CaO, all of MgO, CaO, and $Y_2O_3$, or only $Y_2O_3$, as an additive material. The supporting glass substrate 10 preferably contains MgO of 11% to 35%, and more preferably contains 20% to 30%, as represented by mol % based on oxides. In addition, the supporting glass substrate 10 preferably contains CaO of 7% to 32%, and more preferably contains 8% to 15%, as represented by mol % based on oxides. Furthermore, the supporting glass substrate 10 preferably contains $Y_2O_3$ of 2.8% to 20%, as represented by mol % based on oxides. The contents of the additive materials are in such a range, whereby the ratio ε/d can be increased, and suppressing deflection and reducing weight can be suitably achieved. In addition, the supporting glass substrate 10 may contain at least one selected from the group consisting of $ZrO_2$, $TiO_2$, $Li_2O$, and ZnO in addition to at least one selected from the group consisting of MgO, CaO, and $Y_2O_3$, as an additive material.

Furthermore, the supporting glass substrate 10 preferably has a $SiO_2$ content of 40% to 60%, an $Al_2O_3$ content of 20% to 30%, and a MgO content of 20% to 30%, as represented by mol % based on oxides. In this case, it is preferable that the supporting glass substrate 10 contains only $SiO_2$, $Al_2O_3$, and MgO except for inevitable impurities.

The supporting glass substrate 10 includes no sintered body. That is, the supporting glass substrate 10 is glass that is not a sintered body. The term "sintered body" as used herein refers to a member obtained by heating a plurality of particles at a temperature lower than a melting point to cause the particles are bonded to each other. The sintered body has a high porosity to some extent since vacancies are contained.

By contrast, the supporting glass substrate 10 has a low porosity, usually 0%, since the supporting glass substrate 10 is not a sintered body. However, it is permissible to contain an inevitable small amount of pores. The porosity herein is what is called true porosity, and refers to a value obtained such that a sum of volumes of pores (vacancies) that communicate with the outside and pores (vacancies) that do not communicate with the outside is divided by a total volume (apparent volume). The porosity can be measured according to, for example, JIS R 1634.

The glass used for the supporting glass substrate 10 is usually an amorphous glass, that is, an amorphous solid. In addition, this glass may be a crystallized glass containing crystals on a surface or an inside thereof, but the amorphous glass is preferable from the viewpoint of the density. The sintered body (ceramics) cannot be used due to the low transmittance and the high density.

Next, a shape of the supporting glass substrate 10 will be described. As illustrated in FIG. 1, the supporting glass substrate 10 is a plate-shaped glass substrate including a first surface 12 that is one surface, a second surface 14 that is the other surface, and a side surface 16. The second surface 14 is a surface opposite to the first surface 12, and is, for example, parallel to the first surface 12. The side surface 16 is a side surface of the supporting glass substrate 10 and can be said to be an end surface that connects the first surface 12 and the second surface 14.

In a plan view, that is, in a case of being viewed from a direction orthogonal to the first surface 12, the supporting glass substrate 10 has a circular disc shape. The supporting glass substrate 10 is not limited to a disc shape, and may have any shape, for example, a polygonal plate such as a rectangle.

In addition, a thickness D2 of the supporting glass substrate 10, that is, a length between the first surface 12 and the second surface 14 is preferably 0.1 mm to 2.0 mm, and more preferably 0.1 mm to 0.5 mm. The thickness D2 is set to 0.1 mm or more, whereby the supporting glass substrate 10 can be prevented from becoming too thin. Thus, the deflection or the damage due to an impact can be suppressed. The thickness D2 is set to 2.0 mm or less, whereby an increase in weight can be suppressed, and the thickness D2 is set to 0.5 mm or less, whereby the increase in weight can more suitably be suppressed.

A method of manufacturing the supporting glass substrate 10 is not particularly limited, and any method may be employed. For example, the supporting glass substrate 10 may be manufactured by a method of charging various raw materials such as silica sand and soda ash, which are raw materials of compounds to be contained in the supporting glass substrate 10, into a continuous melting furnace, heating and melting the charged materials at 1500° C. to 1600° C., performing fining, then feeding the resultant to a molding device, molding the fed molten glass into a plate shape, and gradually cooling the plate-shaped glass. Various methods can be employed for manufacturing the supporting glass substrate 10, and examples thereof include a melt casting method, a down draw method (for example, an overflow down draw method, a slot down method, and a redraw method), a float method, a roll out method, a press method, and the like.

Next, an example of a manufacturing process in a case in which the supporting glass substrate 10 is used for manufacturing the FOWLP will be described. In the manufacture of the FOWLP, a plurality of semiconductor chips are bonded onto the supporting glass substrate 10, and the semiconductor chips are covered with a sealing material to form an element substrate. The supporting glass substrate 10 and the element substrate are separated from each other, and an opposite side of the element substrate to the semiconductor chips is bonded onto, for example, another supporting glass substrate 10. Then, wiring, solder bumps, and the like are formed on the semiconductor chips, and the element substrate and the supporting glass substrate 10 are separated again. Furthermore, the element substrate is cut into respective semiconductor chips to be individualized to obtain a semiconductor device.

As described above, in the supporting glass substrate 10 according to the present embodiment, the ratio $\varepsilon/d$ is 32.0 (GPa·cm3/g) or more and has the value larger than the ratio calculation value $\alpha$. The ratio $\varepsilon/d$ is the ratio of the Young's modulus $\varepsilon$ to the density d of the supporting glass substrate 10. The ratio calculation value $\alpha$ is the ratio of the Young's modulus to the density calculated from the composition of the supporting glass substrate 10, and is represented by above-described Expression (2).

There is a case in which the glass substrate is required to achieve both suppressing deflection and reducing weight. It is usually necessary to increase the thickness in order to suppress the deflection; however, it is necessary to reduce the thickness in order to reduce the weight. Therefore, it is difficult to achieve both suppressing deflection and reducing weight. By contrast, in the supporting glass substrate 10 according to the present embodiment, the deflection can be suppressed by setting the ratio $\varepsilon/d$ of the supporting glass substrate 10 to 32.0 (GPa·cm$^3$/g) or more due to the high Young's modulus, even though the thickness of the supporting glass substrate 10 is reduced in order to reduce the weight. Thus it is possible to achieve both suppressing deflection and reducing weight.

Furthermore, in the supporting glass substrate 10, the ratio $\varepsilon/d$ has the value larger than the ratio calculation value $\alpha$ calculated based on the composition. In other words, the Young's modulus per unit density is larger than a value expected based on the composition. Therefore, in the supporting glass substrate 10, suppressing deflection and reducing weight can be achieved to a degree more than expected.

The supporting glass substrate 10 preferably satisfies a relation represented as the ratio $\varepsilon/d$>the ratio calculation value $\alpha+2.0$ (GPa·cm$^3$/g), and more preferably satisfies a relation represented as the ratio $\varepsilon/d$>the ratio calculation value $\alpha+4.0$ (GPa·cm$^3$/g). By satisfying these relations, it is possible to more suitably achieve suppressing deflection and reducing weight.

In addition, in the supporting glass substrate 10, the ratio $\varepsilon/d$ is preferably 37.0 (GPa·cm$^3$/g) or more, and the ratio $\varepsilon/d$ is even more preferably 40.0 (GPa·cm$^3$/g) or more. The ratio $\varepsilon/d$ has the values, whereby suppressing deflection and reducing weight can be suitably achieved.

In addition, in the supporting glass substrate 10, the total content of one or more components selected from the group consisting of MgO, CaO, and $Y_2O_3$ is preferably in the range of 15% to 50% with respect to the total amount of the supporting glass substrate 10, in terms of mol %. The supporting glass substrate 10 contains such materials in such contents, thereby having the higher Young's modulus $\varepsilon$ than expected. Therefore, suppressing deflection and reducing weight can be more suitably achieved.

In addition, in the supporting glass substrate 10, the total content of $SiO_2$ and $Al_2O_3$ is in the range of 50% to 85% with respect to the total amount of the supporting glass substrate 10, in terms of mol %. The supporting glass substrate 10 has the above-described composition, thereby having the higher Young's modulus a than expected, so that suppressing deflection and reducing weight can be more suitably achieved.

In addition, the supporting glass substrate 10 preferably has the thickness D2 in the range of 0.1 mm to 0.5 mm. The thickness D2 is within this range, whereby the weight can be reduced while suppressing the deflection or the damage due to an impact.

In addition, the supporting glass substrate 10 is glass that is not a sintered body. Since the supporting glass substrate 10 is not a sintered body, it is possible to reduce the weight by suppressing the density from becoming too high. Furthermore, since scattering of light due to pores which the sintered body may have does not occur, light transmittance can be secured.

In addition, the supporting glass substrate 10 is preferably an amorphous glass. Since the supporting glass substrate 10 is the amorphous glass, it is possible to reduce the weight by suppressing the density from becoming too high.

The supporting glass substrate 10 is preferably a supporting glass substrate for manufacturing the FOWLP and the like; in other words, at least one of the fan out wafer level package and the fan out panel level package. When the supporting glass substrate 10 is used at least one of manufacturing the fan out wafer level package and manufacturing the fan out panel level package, it is possible to suitably manufacture a semiconductor package.

EXAMPLES

Next, Examples will be described. The embodiment may be modified as long as the effects of the invention are exhibited.

In Examples and Comparative examples, supporting glass substrates having different compositions were prepared. Then, a ratio calculation value $\alpha$ was calculated for each supporting glass substrate, and a Young's modulus $\varepsilon$ and a density d were measured to calculate a ratio $\varepsilon/d$. In addition, a deflection amount and a mass were also measured for each supporting glass substrate, and the supporting glass substrates were evaluated based on the deflection amount and the mass. The details will be described below.

Table 1 illustrates materials used for the supporting glass substrates in Examples and Comparative Examples. Table 1 illustrates the contents of the materials used for preparing the supporting glass substrates with respect to the supporting glass substrates of Example 1 to Example 17 and Comparative Example 1 to Comparative Example 11, as represented by mol % based on oxides.

In each of Examples and Comparative Examples, a raw plate having a diameter of 320 mm and a thickness of 6 mm was manufactured by using a melt casting method with each composition in Table 1. Next, a plurality of plates each of which has a diameter of 300 mm from the center of the raw plate and a thickness of 3 mm were cut out. Both surfaces of each plate were subjected to double-sided polishing using cerium oxide as a polishing material, and the respective plates were adjusted to have thicknesses of 0.4 mm, 0.7 mm, 1.3 mm, or 2.0 mm to prepare supporting glass substrates.

The supporting glass substrates thus prepared were used as samples for the evaluations.

TABLE 1

| | Material composition (mol %) | | | | | | | | | | |
|---|---|---|---|---|---|---|---|---|---|---|---|
| | $SiO_2$ | $Al_2O_3$ | $B_2O_3$ | $P_2O_5$ | $Ga_2O_3$ | MgO | CaO | SrO | BaO | $La_2O_3$ | $Y_2O_3$ |
| Example 1 | 50 | 25 | | | | 25 | | | | | |
| Example 2 | 50 | 20 | | | | 30 | | | | | |
| Example 3 | 43 | 12 | | | | 14 | 32 | | | | |
| Example 4 | 56 | 12 | | | | 24 | 9 | | | | |
| Example 5 | 66 | 12 | 3 | | | 11 | 8 | | | | |
| Example 6 | 53 | 15 | | | | 25 | 7 | | | | |
| Example 7 | 52 | 12 | | | | 22 | 15 | | | | |
| Example 8 | 53 | 12 | | | | 27 | 8 | | | | |
| Example 9 | 53 | 15 | | | | 21 | 10 | | | | |
| Example 10 | 50 | 20 | 10 | | | | | | | | 20 |
| Example 11 | 50 | 6 | 3 | | | 14 | 9 | | | | 2.8 |
| Example 12 | 55 | 20 | 5 | | | | | | | | 20 |
| Example 13 | 40 | 20 | 18 | 2 | | | | | | | 20 |
| Example 14 | 48 | 10 | 5 | | | 14 | 9 | | | | 2.8 |
| Example 15 | 20 | 30 | 30 | | | | | | | | 20 |
| Example 16 | 36 | 25 | 20 | | | | | | | | 19 |
| Example 17 | 40 | 15 | 20 | | 5 | | | | | | 20 |
| Comparative Example 1 | 56 | 24 | | | | | | | | | |
| Comparative Example 2 | 64.1 | 15.4 | | 2.44 | | | | | | | |
| Comparative Example 3 | 60 | | | | | | | | 40 | | |
| Comparative Example 4 | 50 | 20 | | | | | | | | | |
| Comparative Example 5 | 60 | | | | | | | 20 | | | |
| Comparative Example 6 | | | | | | | | | 20 | | |
| Comparative Example 7 | | | | | | | | | | | |
| Comparative Example 8 | 6 | 8 | | 53 | | | | | 15 | 1.5 | |
| Comparative Example 9 | 40 | | 10 | | | | | | 15 | | |
| Comparative Example 10 | 67.1 | 13.1 | 3.6 | | | 2.3 | | | | | |
| Comparative Example 11 | 48 | 32 | | | | | | | | | |

| | Material composition (mol %) | | | | | | | | | | |
|---|---|---|---|---|---|---|---|---|---|---|---|
| | $ZrO_2$ | $TiO_2$ | $Li_2O$ | $Na_2O$ | $K_2O$ | ZnO | $Nb_2O_5$ | $TeO_2$ | $Fe_2O_3$ | $GeO_2$ | $Gd_2O_3$ |
| Example 1 | | | | | | | | | | | |
| Example 2 | | | | | | | | | | | |
| Example 3 | | | | | | | | | | | |
| Example 4 | | | | | | | | | | | |
| Example 5 | | | | | | | | | | | |
| Example 6 | | | | | | | | | | | |
| Example 7 | | | | | | | | | | | |
| Example 8 | | | | | | | | | | | |
| Example 9 | | | | | | | | | | | |
| Example 10 | | | | | | | | | | | |
| Example 11 | 1.2 | 2 | 4 | | | 8 | | | | | |
| Example 12 | | | | | | | | | | | |
| Example 13 | | | | | | | | | | | |
| Example 14 | 1.2 | 2 | 4 | | | 4 | | | | | |
| Example 15 | | | | | | | | | | | |
| Example 16 | | | | | | | | | | | |
| Example 17 | | | | | | | | | | | |
| Comparative Example 1 | | | | | 20 | | | | | | |
| Comparative Example 2 | | | 6.17 | 10.7 | 0.03 | 1.12 | | | | | |
| Comparative Example 3 | | | | | | | | | | | |
| Comparative Example 4 | | | | | 30 | | | | | | |
| Comparative Example 5 | | | 20 | | | | | | | | |
| Comparative Example 6 | | | | | | | | 80 | | | |
| Comparative Example 7 | | | | | | | | 80 | | 20 | |

TABLE 1-continued

|  |  |  |  |  |
|---|---|---|---|---|
| Comparative Example 8 |  | 15 | 1.5 |  |  |
| Comparative Example 9 | 15 |  |  | 10 | 10 |
| Comparative Example 10 |  | 13.7 | 0.1 |  |  |
| Comparative Example 11 |  |  |  |  | 20 |

In Examples and Comparative Examples, the ratio calculation value α was calculated for each supporting glass substrate that is prepared as a sample, based on the material compositions listed in Table 1. Then, the Young's modulus a was measured for each supporting glass substrate that is prepared as a sample using 38DL PLUS manufactured by Olympus Corporation, the density d was measured by the Archimedes' method, and the ratio ε/d was calculated based on the measured Young's modulus ε and density d.

Figure 3:
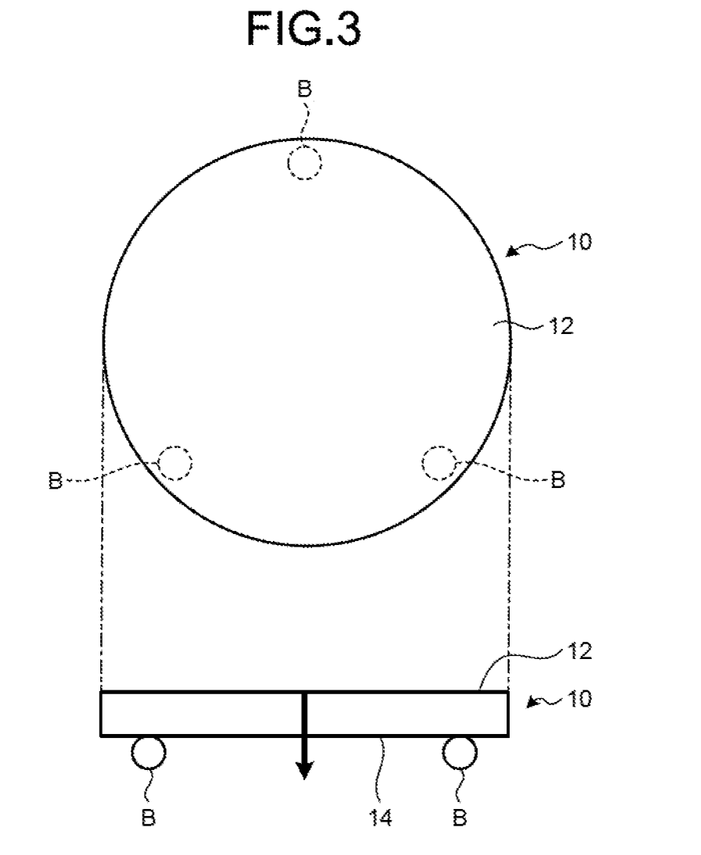
FIG. 3 is a schematic view illustrating a method of measuring deflection in Examples and Comparative Examples.

FIG. 3 is a schematic diagram illustrating a method of measuring deflection in Examples and Comparative Examples. In Examples and Comparative Examples, for each supporting glass substrate that is prepared as a sample, deflection due to its own weight was measured. Specifically, as illustrated in FIG. 3, a deflection amount at a center portion (indicated by an arrow in FIG. 3) of a first surface 12, in a case in which a second surface 14 of the supporting glass substrate used as a sample was supported at three points by supporting units B, was measured with Dyvoce manufactured by Kohzu Precision Co., Ltd. A diameter of each supporting unit B was 1.6 mm, and the supporting unit B was arranged such that a central position was overlapped at 5.0 mm radially inward from an outer peripheral portion of the supporting glass substrate. In addition, the mass was measured for each supporting glass substrate that is prepared as a sample.

Figure 4:
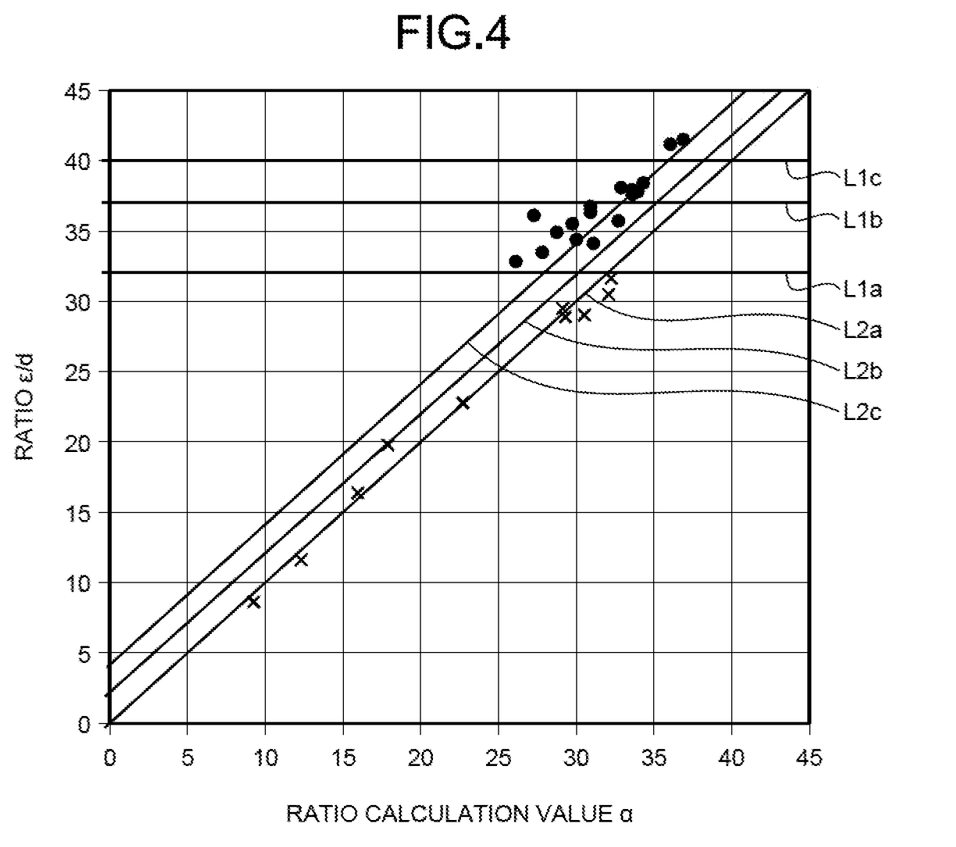
FIG. 4 is a graph illustrating features of supporting glass substrates in Examples and Comparative Examples.

Table 2 lists the evaluation results of Examples and Comparative Examples. FIG. 4 is a graph illustrating features of the supporting glass substrates of Examples and Comparative Examples. Table 2 illustrates, for each supporting glass substrate used as a sample, the ratio calculation value α, the Young's modulus ε, the density d, the ratio ε/d, the deflection amount for each thickness D2, the mass of the sample having a thickness of 2.0 mm, the determination result of the deflection and mass, and the comprehensive determination result.

As illustrated in Table 2, in Example 1 to Example 17, the ratio ε/d is 32.0 (GPa·cm³/g) or more, and the ratio ε/d is larger than the ratio calculation value α. By contrast, Comparative Example 1 to Comparative Example 11 do not satisfy at least one of a condition that the ratio ε/d is 32.0 (GPa·cm³/g) or more and a condition that the ratio ε/d is larger than the ratio calculation value α.

FIG. 4 is a graph in which a relation between the ratio ε/d of the supporting glass substrate used as a sample and the ratio calculation value α of the supporting glass substrate used as a sample is plotted. Black circles in FIG. 4 indicate the supporting glass substrates of Example 1 to Example 17, and crosses indicate the supporting glass substrates of Comparative Example 1 to Comparative Example 11. In FIG. 4, it is also found that the supporting glass substrates of Example 1 to Example 17 have the ratio ε/d of 32.0 (GPa·cm³/g) or more, and have the ratio ε/d larger than the ratio calculation value α, and the supporting glass substrates of Comparative Example 1 to Comparative Example 11 do not satisfy at least one of those conditions. According to FIG. 4, it is found that in the present examples, the ratio ε/d deviates from the ratio calculation value α that is the calculated value, but in Comparative Examples, the ratio ε/d of a sample the ratio ε/d of which is particularly high does not deviate from the ratio calculation value α that is the calculated value.

TABLE 2

| | Measurement result | | | | | | | | | | |
|---|---|---|---|---|---|---|---|---|---|---|---|
| | Ratio calculation value α | Young's modulus (ε) | Density (d) | Ratio ε/d | Deflection (mm) | | | | Mass (g) | Determination | Comprehensive- |
| | | | | | 0.4 mm | 0.7 mm | 1.3 mm | 2.0 mm | 2.0 mm | Deflection  Mass | determination |
| Example 1 | 36.8 | 111 | 2.68 | 41.4 | 0.79 | 0.26 | 0.08 | 0.03 | 378.9 | A   A | A |
| Example 2 | 36.0 | 111 | 2.69 | 41.1 | 0.79 | 0.26 | 0.08 | 0.05 | 380.0 | A   A | A |
| Example 3 | 31.0 | 105 | 2.86 | 36.6 | 0.88 | 0.29 | 0.08 | 0.04 | 404.2 | B   B | B |
| Example 4 | 33.5 | 100 | 2.66 | 37.7 | 0.89 | 0.29 | 0.08 | 0.04 | 375.6 | B   A | B |
| Example 5 | 32.7 | 89 | 2.50 | 35.7 | 0.92 | 0.31 | 0.09 | 0.04 | 354.1 | C   A | C |
| Example 6 | 34.3 | 103 | 2.68 | 38.4 | 0.85 | 0.28 | 0.08 | 0.03 | 378.9 | B   A | B |
| Example 7 | 32.8 | 104 | 2.73 | 38.1 | 0.85 | 0.28 | 0.08 | 0.03 | 385.7 | B   A | B |
| Example 8 | 33.6 | 102 | 2.69 | 37.9 | 0.86 | 0.29 | 0.08 | 0.04 | 380.9 | B   A | B |
| Example 9 | 33.9 | 101 | 2.68 | 37.8 | 0.87 | 0.29 | 0.08 | 0.04 | 378.7 | B   A | B |
| Example 10 | 30.0 | 118 | 3.44 | 34.4 | 0.94 | 0.31 | 0.09 | 0.04 | 486.3 | C   C | C |
| Example 11 | 28.8 | 107 | 3.02 | 35.5 | 0.92 | 0.31 | 0.09 | 0.04 | 427.2 | C   B | C |
| Example 12 | 31.1 | 119 | 3.49 | 34.1 | 0.95 | 0.32 | 0.09 | 0.04 | 492.8 | C   C | C |
| Example 13 | 27.8 | 113 | 3.37 | 33.4 | 0.97 | 0.32 | 0.09 | 0.04 | 476.1 | C   C | C |
| Example 14 | 30.9 | 106 | 2.81 | 36.3 | 0.90 | 0.30 | 0.09 | 0.04 | 411.5 | C   B | C |
| Example 15 | 27.3 | 122 | 3.38 | 36.2 | 0.90 | 0.30 | 0.09 | 0.04 | 477.5 | C   C | C |
| Example 16 | 28.8 | 117 | 3.36 | 35.0 | 0.93 | 0.31 | 0.09 | 0.04 | 474.5 | C   C | C |
| Example 17 | 26.2 | 116 | 3.52 | 32.8 | 0.98 | 0.33 | 0.09 | 0.04 | 497.9 | C   C | C |
| Comparative Example 1 | 32.1 | 75 | 2.46 | 30.4 | 1.07 | 0.36 | 0.10 | 0.04 | 347.2 | D   A | D |

TABLE 2-continued

| | Ratio calculation value α | Young's modulus (ε) | Density (d) | Ratio ε/d | Deflection (mm) 0.4 mm | 0.7 mm | 1.3 mm | 2.0 mm | Mass (g) 2.0 mm | Determination Deflection | Mass | Comprehensive determination |
|---|---|---|---|---|---|---|---|---|---|---|---|---|
| Comparative Example 2 | 32.3 | 77 | 2.43 | 31.6 | 1.04 | 0.35 | 0.10 | 0.04 | 343.5 | D | A | D |
| Comparative Example 3 | 22.7 | 79 | 3.45 | 22.8 | 1.39 | 0.47 | 0.24 | 0.06 | 487.7 | D | C | D |
| Comparative Example 4 | 29.3 | 73 | 2.51 | 28.9 | 1.12 | 0.38 | 0.11 | 0.05 | 354.9 | D | A | D |
| Comparative Example 5 | 29.2 | 89 | 3.01 | 29.4 | 2.10 | 0.37 | 0.11 | 0.05 | 425.5 | D | B | D |
| Comparative Example 6 | 9.3 | 49 | 5.55 | 8.7 | 3.17 | 1.22 | 0.36 | 0.15 | 785.2 | D | D | D |
| Comparative Example 7 | 12.3 | 61 | 5.22 | 11.6 | 2.53 | 0.94 | 0.27 | 0.12 | 738.2 | D | D | D |
| Comparative Example 8 | 15.8 | 49 | 3.00 | 16.4 | 1.87 | 0.66 | 0.19 | 0.08 | 424.4 | D | B | D |
| Comparative Example 9 | 17.9 | 70 | 3.53 | 19.8 | 1.58 | 0.55 | 0.16 | 0.07 | 499.2 | D | C | D |
| Comparative Example 10 | 30.5 | 69 | 2.39 | 29.0 | 1.13 | 0.38 | 0.11 | 0.05 | 337.9 | D | A | D |
| Comparative Example 11 | 33.1 | 126 | 4.39 | 28.8 | 1.13 | 0.38 | 0.11 | 0.05 | 620.1 | D | D | D |

In the determination of the deflection amount in Table 2,
a case in which the deflection amount is less than 0.8 mm is denoted by A,
a case in which the deflection amount is 0.8 mm or more and less than 0.9 mm is denoted by B,
a case in which the deflection amount is 0.9 mm or more and less than 1.0 mm is denoted by C, and
a case in which the deflection amount is 1.0 mm or more is denoted by D.
A, B, and C are determined to be acceptable.
In the determination of the mass in Table 2,
a case in which the mass is less than 400 g is denoted by A,
a case in which the mass is 400 g or more and less than 430 g is denoted by B,
a case in which the mass is 430 g or more and less than 500 g is denoted by C, and
a case in which the mass is 500 g or more is denoted by D.
A, B, and C are determined to be acceptable.
In addition, in a case in which both the deflection amount and the mass are denoted by A, the comprehensive determination is denoted by A,
in a case in which both the deflection amount and the mass are not denoted by C or D and at least one of the deflection amount and the mass is denoted by B, the comprehensive determination is denoted by B,
in a case in which both the deflection amount and the mass are not denoted by D and at least one of the deflection amount and the mass is denoted by C, the comprehensive determination is denoted by C, and
in a case in which at least one of the deflection amount and the mass is denoted by D, the comprehensive determination is denoted by D.
In the comprehensive determination, A, B, and C are also determined to be acceptable.
As listed in Table 2, the deflection amount and the mass of each of the supporting glass substrates according to Example 1 to Example 17 were determined to be acceptable. By contrast, at least one of the deflection amount and the mass of each of the supporting glass substrates according to Comparative Example 1 to Comparative Example 11 was determined to be unacceptable. That is, it is found that in the supporting glass substrates of the present examples, each of which has the ratio ε/d of 32.0 (GPa·cm³/g) or more and the ratio ε/d larger than the ratio calculation value α, both suppressing deflection and reducing weight were achieved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A supporting glass substrate for manufacturing at least one of a fan out wafer level package and a fan out panel level package, having a ratio ε/d (GPa·cm³/g) of a Young's modulus ε (GPa) to a density d (g/cm³) that is 37.0 (GPa·cm³/g) or more and the ratio ε/d (GPa·cm³/g) has a value larger than a ratio calculation value α (GPa·cm³/g), the ratio calculation value α (GPa·cm³/g) being a ratio of a Young's modulus ε (GPa) to a density (g/cm³) calculated from a composition, wherein
a content of $SiO_2$ is in a range of 40% to 60%, a content of $Al_2O_3$ is in a range of 20% to 30%, a content of MgO is in a range of 20% to 30%, with respect to a total amount of the supporting glass substrate in terms of mol %, and the supporting glass substrate contains only $SiO_2$, $Al_2O_3$, and MgO except for inevitable impurities
or, a total content of $SiO_2$ and $Al_2O$ is in a range of 60% to 75%, a content of MgO is in a range of 20% to 30%, a content of CaO is in a range of 8% to 15%, with respect to a total amount of the supporting glass substrate in terms of mol %, and the supporting glass substrate contains only $SiO_2$, $Al_2O_3$, MgO, and CaO except for inevitable impurities
the ratio calculation value α (GPa·cm³/g) is represented by the following expression:

$$\alpha = 2 \cdot \Sigma\{(V_i \cdot G_i/M_i) \cdot X_i\}$$

where, in the expression, $V_i$ is a filling parameter of a metal oxide contained in the supporting glass substrate, $G_i$ is a dissociation energy of a metal oxide contained in the supporting glass substrate, $M_i$ is a molecular weight of a metal oxide contained in the supporting glass substrate, and $X_i$ is a molar ratio of a metal oxide contained in the supporting glass substrate, wherein $V_i$ and $G_i$ are represented by the following expressions:

$$V_i = 6.02 \cdot 10^{23} \cdot (4/3) \cdot \pi \cdot (x \cdot r^3_M + y \cdot r^3_o)$$

$$G_i = d_i/M_i \cdot \{x \cdot \Delta Hf(M_{gas}) + y \cdot \Delta Hf(O_{gas}) - \Delta Hf(M_xO_{ycrystal}) - (x+y) \cdot RT,$$

wherein

M is a metal element,

O is an oxygen element, x is a valence of the metal element M, y is a valence of the oxygen element O, $r_M$ is Shannon's ionic radii of the metal element M in the metal oxide $M_xO_y$, $r_O$ is Shannon's ionic radii of the oxygen element O in the metal oxide $M_xO_y$, $d_i$ is the density of the metal oxide $M_xO_y$, $\Delta Hf(M_{gas})$ is the standard enthalpy of formation of the metal element M in a gas state, $\Delta Hf(O_{gas})$ is the standard enthalpy of formation of the oxygen element O in a gas state, $\Delta Hf(M_xO_{ycrystal})$ is the standard enthalpy formation of the metal oxide $M_xO_y$, R is a gas constant, and T is an absolute temperature.

2. The supporting glass substrate according to claim 1, wherein a relation represented as the ratio ε/d (GPa·cm³/g) >the ratio calculation value α (GPa·cm³/g)+2.0 (GPa·cm³/g) is satisfied.

3. The supporting glass substrate according to claim 2, wherein a relation represented as the ratio ε/d (GPa·cm³/g) >the ratio calculation value α (GPa·cm³/g)+4.0 (GPa·cm³/g) is satisfied.

4. The supporting glass substrate according to claim 1, wherein the ratio ε/d (GPa·cm³/g) is 40.0 (GPa·cm³/g) or more.

5. The supporting glass substrate according to claim 1, wherein the supporting glass substrate has a thickness in a range of 0.1 mm to 0.5 mm.

6. The supporting glass substrate according to claim 1, wherein the supporting glass substrate is an amorphous glass.

\* \* \* \* \*